United States Patent
Cheng et al.

(10) Patent No.: US 6,702,930 B1
(45) Date of Patent: Mar. 9, 2004

(54) METHOD AND MEANS FOR ENHANCING UTILIZATION OF SPUTTERING TARGETS

(75) Inventors: Yuanda Randy Cheng, Singapore (SG); Dennis Brown, Morgan Hill, CA (US); Jianzhong Shi, Singapore (SG); Wee Ching Freddy Goh, Singapore (SG); Wah Meng John Soh, Singapore (SG); Steven Hiroshi Sawasaki, Singapore (SG)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 10/431,472

(22) Filed: May 8, 2003

(51) Int. Cl.⁷ .............................................. C23C 14/35
(52) U.S. Cl. ........................ 204/192.2; 204/192.12; 204/192.15; 204/298.12; 204/298.13; 204/298.19; 204/298.2
(58) Field of Search ....................... 204/192.12, 192.15, 204/192.2, 298.12, 298.13, 298.19, 298.2

(56) References Cited

U.S. PATENT DOCUMENTS

| | | | |
|---|---|---|---|
| 3,956,093 A | | 5/1976 | McLeod |
| 4,198,283 A | * | 4/1980 | Class et al. ............ 204/298.19 |
| 4,200,510 A | | 4/1980 | O'Connell et al. |
| 5,487,823 A | | 1/1996 | Sawada et al. |
| 5,490,914 A | | 2/1996 | Hurwitt et al. |
| 5,944,967 A | | 8/1999 | Kunz et al. |
| 6,068,742 A | * | 5/2000 | Daxinger et al. ...... 204/298.09 |
| 6,340,415 B1 | | 1/2002 | Raaijmakers et al. |
| 6,344,117 B2 | | 2/2002 | Enomoto et al. |
| 6,497,797 B1 | | 12/2002 | Kim |
| 6,521,108 B1 | | 2/2003 | Zhang |

* cited by examiner

Primary Examiner—Rodney G. McDonald
(74) Attorney, Agent, or Firm—McDermott, Will & Emery

(57) ABSTRACT

A method of sputtering a target, comprising steps of:
(a) providing a magnetically enhanced sputtering apparatus comprising a sputtering target having a first, sputtering surface and a second, opposing surface in electrical contact with a cathode electrode of the sputtering apparatus;
(b) sputtering the first surface of the target to form a first erosion track therein;
(c) removing the target from the sputtering apparatus when the first erosion track reaches a predetermined depth below the first surface;
(d) reinstalling the sputtering target in the sputtering apparatus such that the second surface is the sputtering surface and the first surface is the opposing surface and is in electrical contact with the cathode via an intervening backing plate comprised of at least one material selected for causing a second erosion track to be formed in the second surface of the target during sputtering therefrom which is laterally displaced from the first erosion track; and
(e) sputtering the second surface of the target to form the laterally displaced second erosion track therein to a predetermined depth below the second surface, thereby increasing the utilization of the sputtering target.

20 Claims, 3 Drawing Sheets

METHOD AND MEANS FOR ENHANCING UTILIZATION OF SPUTTERING TARGETS

FIELD OF THE INVENTION

The present invention relates to a method and means for increasing the utilization (i.e., lifetime) of cathode sputtering targets. The invention has particular utility in magnetron sputtering of targets comprising costly components, e.g., as in the manufacture of magnetic and magneto-optical ("MO") recording media comprising magnetic alloys including precious and/or rare metals.

BACKGROUND OF THE INVENTION

Magnetic and MO recording media are widely employed in various applications, particularly in the computer industry for data/information storage and retrieval purposes. A magnetic medium in e.g., disk form, such as utilized in computer-related applications, typically comprises a non-magnetic metal substrate, e.g., of an aluminum (Al)-based alloy such as aluminum-magnesium (Al—Mg), having at least one major surface on which a layer stack comprising a plurality of thin film layers constituting the medium are sequentially deposited. Such layers may include, in sequence from the substrate surface, a plating layer, e.g., of amorphous nickel-phosphorus (NiP), a polycrystalline underlayer, typically of chromium (Cr) or a Cr-based alloy, a magnetic layer, e.g., of a cobalt (Co)-based alloy, and a protective overcoat layer, typically of carbon (C) or carbon doped with at least one of hydrogen (H), nitrogen (N), and fluorine (F).

According to conventional manufacturing methodology, a majority of the layers are deposited by cathode sputtering. A similar situation exists in the manufacture of magneto-optical (MO) media, in which a layer stack comprising a plurality of thin film layers, such as alloy layers having reflective properties or thermo-magnetic properties (e.g., TbFeCo, etc.) for functioning as writing, writing assist, and read-out layers, are sequentially sputter deposited on a suitable substrate surface.

The areal recording density (e.g., bits/in$^2$) of magnetic data storage media has increased rapidly and significantly in recent years, and, to accommodate this rapid increase in areal density, both media performance and manufacturing cost have become extremely critical. Precious metal-containing sputtering targets, e.g., of Co-based magnetic alloys containing Pt, such as CoCrPt and CoCrPtB, are commonly utilized in the manufacture of magnetic recording media in order to provide the very high magnetic anisotropies required for obtaining the increased areal recording densities. A similar situation exists with MO recording media, wherein the thermo-magnetic layer(s) comprise rare elements such as Tb. However, due to the high cost of the precious or rare metals, e.g., Pt and Tb, sputtering targets comprising same are very costly. Further, when sputtering targets, particularly magnetically enhanced targets, e.g., magnetron targets, are utilized according to conventional practices, the target material usage is typically limited to 30–40 wt. % or less. Thus, the high purchase cost and low utilization of conventional sputtering targets disadvantageously result in increased manufacturing cost of magnetic and MO recording media.

Therefore, there exists a clear need for improved sputtering target means and methodology for increasing target utilization, particularly of precious metal-containing targets, to greater than about 40 wt. %, while maintaining good performance and film uniformity of the resultant thin-film magnetic or MO recording media.

The present invention addresses and solves the problems and drawbacks attendant upon the poor utilization of sputtering targets, such as planar magnetron sputtering targets comprising expensive precious metal components, while maintaining full compatibility with all aspects of conventional automated manufacturing technology for thin-film magnetic and MO recording media. Further, the methodology and means afforded by the present invention enjoy diverse utility in the manufacture of numerous and different devices requiring sputtered thin film layers and/or coatings, e.g., optical devices, architectural glass, semiconductor devices, protective and decorative coatings, etc.

DISCLOSURE OF THE INVENTION

An advantage of the present invention is an improved method for performing sputtering of a target, whereby utilization of the target material is significantly increased.

Another advantage of the present invention is an improved sputtering target providing significantly increased utilization of the target material.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are obtained in part by a method of sputtering a target, comprising steps of:

(a) providing a magnetically enhanced sputtering apparatus comprising a sputtering target having a first, sputtering surface and a second, opposing surface facing and in electrical contact with a cathode of the sputtering apparatus;

(b) sputtering the first surface of the target to form a first erosion track therein;

(c) removing the target from the sputtering apparatus when the first erosion track reaches a predetermined depth below the first surface;

(d) reinstalling the sputtering target in the sputtering apparatus such that the second surface is the sputtering surface and the first surface is the opposing surface and faces and is in electrical contact with the cathode via an intervening backing plate, the backing plate being comprised of at least one material selected for causing a second erosion track to be formed in the second surface of the target during sputtering therefrom which is laterally displaced from the first erosion track; and (e) sputtering the second surface of the target to form the laterally displaced second erosion track therein to a predetermined depth below the second surface, thereby increasing the utilization of the sputtering target.

According to preferred embodiments of the present invention, step (a) comprises providing a magnetron sputtering apparatus, e.g., a planar magnetron sputtering apparatus; and providing a sputtering target comprised of a material for forming a layer of a thin film magnetic or magneto-optical (MO) recording medium, e.g., comprised of a material selected from the group consisting of nonmagnetic metals or alloys, magnetic metals or alloys, dielectrics, thermo-magnetic alloys, and carbon or carbon compounds.

In accordance with preferred embodiments of the present invention, step (d) comprises providing a backing plate comprised of a material which affects (i.e., alters) passage of magnetic flux through the target; wherein the composition and thickness of the backing plate are selected for obtaining the desired laterally spaced second erosion track on the second surface of the sputtering target.

According to further preferred embodiments of the present invention, step (d) comprises providing a backing plate comprised of Cr or a CoCr alloy, e.g., wherein the Cr content ranges from 0 to about 100 at. %, and the thickness ranges from about 0.1 to about 1 inch.

Another aspect of the present invention is a sputtering target comprising:

opposing first and second major surfaces, the first surface including a first erosion track formed therein by sputtering therefrom in a magnetically enhanced sputtering apparatus; and a backing plate mounted on the first surface, the backing plate being comprised of at least one material selected for causing a second erosion track to be formed in the second surface of the target during sputtering therefrom in the magnetically enhanced sputtering apparatus, the second erosion track being laterally displaced from the first erosion track.

According to preferred embodiments of the present invention, the sputtering target is comprised of a material for forming a layer of a thin film magnetic or magneto-optical (MO) recording medium, e.g., a material selected from the group consisting of non-magnetic metals or alloys, magnetic metals or alloys, dielectrics, thermo-magnetic alloys, and carbon or carbon compounds; and the backing plate is comprised of a material which alters passage of magnetic flux through the target, wherein the composition and thickness of the backing plate are selected for obtaining the laterally displaced second erosion track on the second surface of the sputtering target.

Preferred embodiments of the invention include those wherein the backing plate is comprised of Cr or a CoCr alloy, wherein the Cr content ranges from 0 to about 100 at. % and the backing plate has a thickness ranging from about 0.1 to about 1 inch.

Yet another aspect of the present invention is magnetically enhanced sputtering apparatus comprising the above-described improved sputtering target comprising a backing plate mounted the first target surface having a first erosion pattern formed therein, with the backing plate operatively connected to a cathode of the sputtering apparatus and the second target surface functioning as the sputtering surface, wherein the backing plate is comprised of at least one material selected for causing a second erosion track to be formed in the second surface of the target during sputtering therefrom, the second erosion track being laterally displaced from the first erosion track.

Still another aspect of the present invention is a method of sputtering a target, comprising steps of:

(a) sputtering a first side of the target to form a first erosion pattern therein; and (b) sputtering a second side of the target to form a second erosion pattern therein, the second erosion pattern being offset from the first erosion pattern.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which like reference numerals are employed throughout to designate similar features and wherein the features are not necessarily drawn to scale but rather drawn as to best illustrate the pertinent features, wherein.

DESCRIPTION OF THE INVENTION

The present invention is based upon the finding by the inventors that the effective lifetime, hence target material utilization, of sputtering targets employed in magnetically assisted sputtering processes, e.g., as with planar magnetron sputtering apparatus, can be substantially enhanced, i.e., increased relative to that associated with conventional sputtering methodology utilizing a single side of the sputtering target, by sequentially sputtering from first and second sides (surfaces) of the target in such a manner that the respective erosion patterns formed on the opposed sputtering surfaces are mutually laterally displaced to minimize overlap, thereby eliminating, or at least substantially reducing, the likelihood of target penetration at overlapping erosion tracks, whereby target integrity is maintained over extended sputtering intervals, resulting in more complete utilization of the target material.

A feature of the present invention is the use of a target backing plate interposed between the first side of the target and the cathode of the sputtering apparatus when performing sputtering of the second side of the target, the target material being comprised of at least one material selected for causing the erosion track formed in the second side of the target to be laterally displaced from the erosion track previously formed in the first side of the target.

A sputtering process according to the present invention therefore includes sequential steps of:

(1) providing a magnetically enhanced sputtering apparatus including a 2-sided sputtering target having a first surface oriented for sputtering therefrom and a second, opposite surface facing and in electrical contact with a cathode of the sputtering apparatus;

(2) performing magnetically assisted sputtering, e.g., planar magnetron sputtering, of the first surface in conventional manner to form a first erosion track therein;

(3) removing the target from the sputtering apparatus;

(4) mounting a backing plate of the selected erosion track-shifting (or displacing) material on the first surface of the target having the first erosion track formed therein;

(5) reinstalling the target in the sputtering apparatus such that the second surface is oriented for sputtering therefrom and the first surface faces and is in electrical contact with the cathode via the backing plate;

(6) performing magnetically assisted sputtering, i.e., planar magnetron sputtering, of the second surface to form a second erosion track therein which is laterally displaced from the first erosion track formed in the first surface, thereby increasing utilization of the target material.

Figure 1:
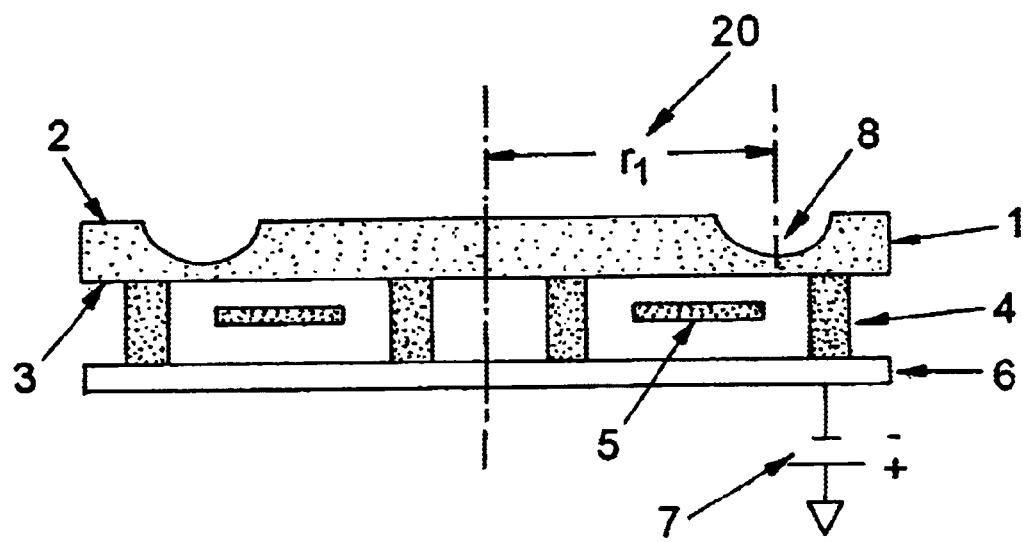
FIG. 1 is a simplified schematic, cross-sectional view illustrating the essential structural features and operating principle of a conventional planar magnetron sputtering apparatus, wherein a first erosion track is formed in a first surface of a sputtering target.

Referring to FIG. 1, shown therein is a simplified schematic, cross-sectional view illustrating the essential structural features and operating principle of an illustrative, but not limitative, embodiment of a conventional planar magnetron sputtering apparatus 20, wherein a first erosion track is formed in a first surface of a sputtering target. According to the illustrated embodiment, sputtering apparatus 20 comprises a generally circularly-shaped sputtering target 1 having opposing first and second generally flat planar surfaces 2 and 3, respectively, with the first surface 2 upwardly oriented for sputtering therefrom and the second surface 3 facing and in electrical contact, via a plurality of spaced-apart, electrically conductive magnetic pole pieces 4, with a cathode electrode 6 electrically connected to a source 7 of electrical potential (illustratively a source of negative DC potential; however, a source 7 of RF potential may also be utilized). Apparatus 20 further comprises magnetic shunts 5 for directing the magnetic flux provided by pole pieces 4 along desired paths for effecting sputtering of upwardly facing target surface 2.

As is well known in the field of magnetron sputtering, magnetic flux lines from first polarity magnetic pole pieces 4 located below the target 1 enter the target and arch over the upwardly facing sputtering surface 2 before exiting the target and returning to second, opposite polarity magnetic pole pieces 4 also located below target 1 to produce a closed-loop "racetrack" in which sputtering plasma is concentrated. The location above upwardly facing sputtering surface 2 at which the magnetic flux lines running between the opposite polarity magnetic poles are generally parallel thereto corresponds to the location in target surface 2 where maximum sputtering, hence maximum erosion, occurs, with substantially less erosion occurring at locations where the magnetic flux lines deviate from parallelism with target surface 2. The result is formation of an erosion track 8 in upwardly facing target surface 2, i.e., the first (sputtering) surface, which erosion track 8, in the illustrated embodiment, is generally hemispherically-shaped with a maximum depth at target radius $r=r_1$, wherein $r$ is determined, inter alia, by the strength of the magnetic flux field provided by magnetic poles 4.

According to the invention, magnetically assisted, i.e., planar magnetron sputtering, of first target surface 2 is performed for an interval sufficient to form an erosion track 8 of having a desired maximum erosion depth at radius $r_1$, after which interval sputtering from the first target surface 2 is terminated and target 1 removed from apparatus 20.

Figure 2:
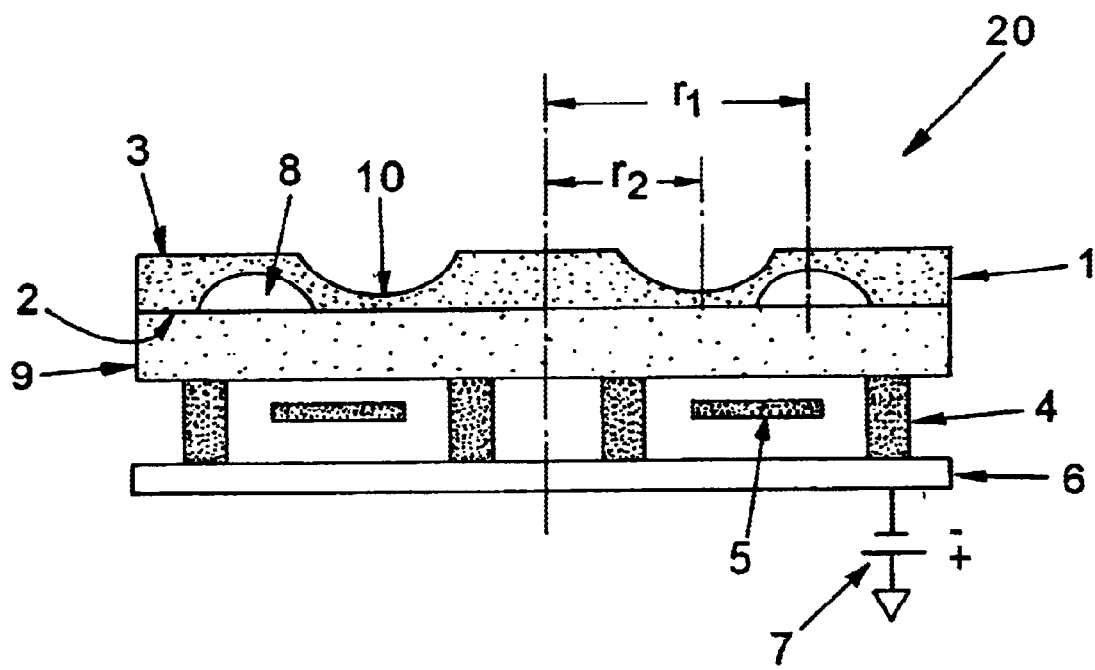
FIG. 2 is a simplified schematic, cross-sectional view illustrating the essential structural features and operating principle of the planar magnetron sputtering apparatus according to the present invention, wherein a second erosion track which is laterally displaced from the first erosion track is formed in the second surface of the sputtering target by means of an interposed backing plate.

Referring to FIG. 2, according to the next steps of the invention, a backing plate 9 of a selected erosion track-shifting (or displacing) material is mounted on the first surface 2 of the target 1 having the first erosion track 8 formed therein and target 1 is reinstalled in the sputtering apparatus 20 such that the second surface 3 thereof is upwardly oriented for sputtering therefrom and the first surface 2 faces and is in electrical contact with the cathode electrode 6 via the backing plate 9 and the magnetic pole pieces 4.

Magnetically assisted, i.e., planar magnetron sputtering, of the second surface 3 is, according to the invention, then performed for a sufficient interval to form a second, generally hemispherically-shaped erosion track 10 therein which has a maximum erosion depth at radius $r=r_2$, wherein $r_2<r_1$, i.e., the maximum erosion depth of the second erosion track 10 formed in the second surface 3 is laterally inwardly displaced from the maximum erosion depth of the first erosion track 8 formed in the first surface 2, thereby resulting in at least a partial separation of the erosion tracks formed in the opposing sputtering surfaces.

As a consequence of the lateral displacement (or shifting) of the locations of maximum target erosion of the first and second erosion tracks 8 and 10 formed on the opposing first and second target surfaces 2 and 3, respectively, the invention advantageously facilitates maximum utilization of both surfaces of target 1 without incurring likelihood of target failure, as by penetration resulting from overlapping erosion tracks. The advantage of increased target utilization afforded by the present invention is especially significant when the target is comprised of costly materials, e.g., noble and rare-earth metals.

According to the invention, backing plate 9 is preferably comprised of a material which affects, i.e., alters, passage of magnetic flux through target 1, the composition and thickness of the backing plate being selected for obtaining the desired laterally spaced second erosion track 10 on the second surface 2 of the sputtering target. In the illustrated embodiment, the reduced magnetic flux and increased target-magnet separation afforded by the backing plate result in a widened second erosion track 10 (i.e., greater diameter of the hemispherically-shaped erosion track), inasmuch as the reduced strength magnetic field results in less-focussed sputtering produced by the plasma.

By way of illustration, but not limitation, backing plate 9 may be comprised of Cr or a CoCr alloy, e.g., wherein the Cr content ranges from 0 to about 100 at. %, and the thickness ranges from about 0.1 to about 1 inch.

According to preferred embodiments of the invention, the sputtering target is comprised of a material for forming a layer of a thin film magnetic or magneto-optical (MO) recording medium, e.g., a material selected from the group consisting of non-magnetic metals or alloys, magnetic metals or alloys, dielectrics, thermo-magnetic alloys, and carbon or carbon compounds.

EXAMPLES

Figure 3:
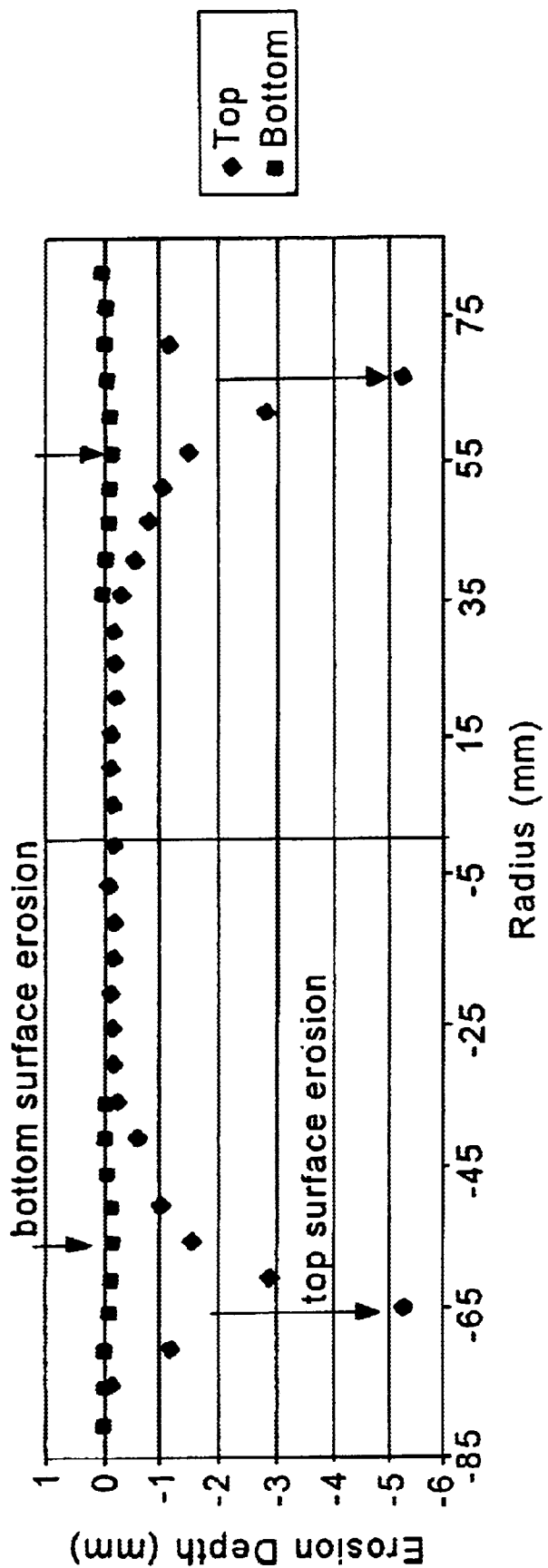
FIG. 3 is a graph illustrating the depths and radial positions of laterally displaced first and second erosion tracks formed in respective first and second opposing sides of a Ru sputtering target with a CoCr alloy backing plate.

Referring to FIG. 3, shown therein is a graph illustrating the depths and radial positions of laterally displaced first and second erosion tracks formed in respective first and second opposing sides of a Ru sputtering target with a CoCr alloy backing plate, utilizing the inventive methodology. Due to a relatively short sputtering interval, the second side 3 of the target 1 experienced only a limited amount of erosion. Nonetheless, the graph of FIG. 3 clearly shows the laterally displaced erosion tracks formed on the first 2 and second 3 surfaces of target 1, whereby the location of maximum depth of the erosion track 8 formed on the first surface 2 is advantageously laterally shifted from the location of the maximum depth of the erosion track 10 formed on the second surface 3, thereby minimizing the likelihood of target penetration due to overlapping erosion tracks.

Figure 4:
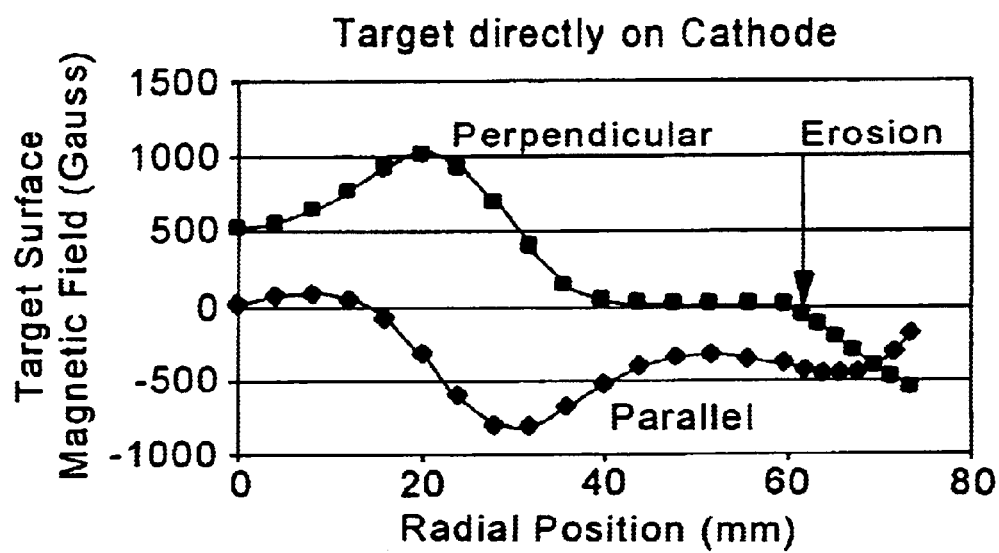
FIG. 4 is a graph illustrating the distribution of magnetic flux (B) on a Ru sputtering target mounted directly on a cathode of a planar magnetron sputtering apparatus.
Figure 5:
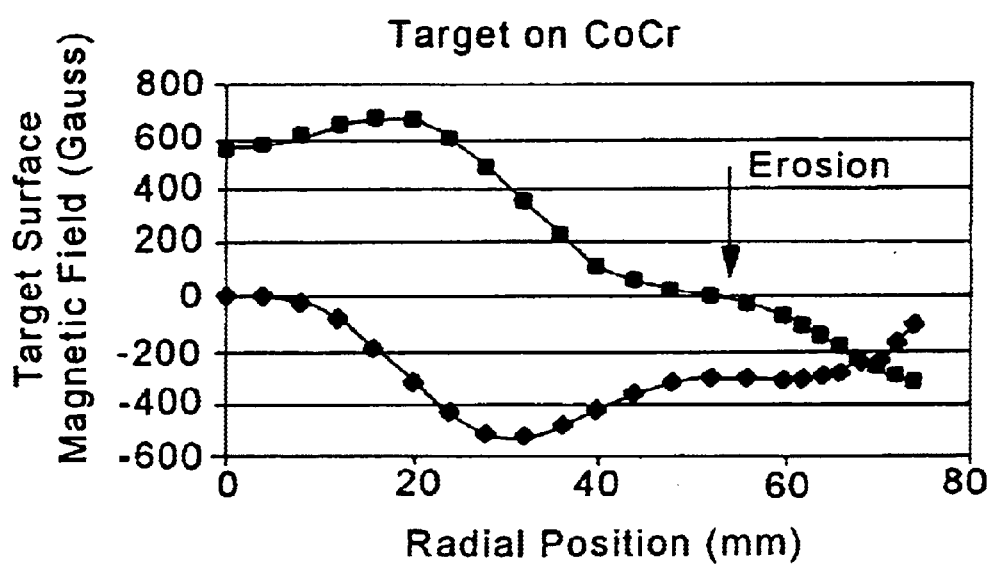
FIG. 5 is a graph illustrating the distribution of magnetic flux (B) on a Ru sputtering target mounted on a cathode of a planar magnetron sputtering apparatus via a flux-shifting backing plate according to the invention.

Adverting to FIGS. 4 and 5, shown therein are graphs for respectively illustrating the distribution of magnetic flux (B) on a Ru sputtering target mounted directly on a cathode of a planar magnetron sputtering apparatus and the distribution of magnetic flux (B) on a Ru sputtering target mounted on a cathode of a planar magnetron sputtering apparatus via a flux-shifting backing plate according to the invention.

As is evident from FIG. 4, when the first surface 2 of target 1 is sputtered (i.e., without backing plate 9), the zero position for $B_{perpendicular}$, thus the position of the first erosion track 8, is located at a radius $r_1$ of about 60 mm, with $B_{parallel}$ of about 400 Gauss. By contrast, when the second surface 3 of target 1 is sputtered with a CoCr backing plate 9 fastened to the first surface 2 of target 1, the zero position for $B_{perpendicular}$, thus the position of the second erosion track 10, is located at a radius $r_2$ of about 50 mm, with $B_{parallel}$ of about 300 Gauss. The lateral displacement (or offset) of the first and second erosion tracks makes it possible to reliably sputter both sides of the target without significant likelihood of target failure due to penetration at overlapping regions of maximum erosion. In addition, the reduced $B_{parallel}$ field provided by the CoCr backing plate widens the second erosion track 10, resulting in increased target utilization and lifetime. Target utilizations >~40% are obtainable according to the inventive methodology.

Thus, the present invention advantageously provides methodology and apparatus for obtaining significantly increased utilization and lifetime of sputtering targets utilized in magnetically assisted sputtering, e.g., planar magnetron sputtering, thereby effecting substantial cost reduction and reduced equipment downtime necessitated by frequent target replacement. The inventive methodology and apparatus are particularly useful when the targets are comprised of costly materials, such as noble metals, rare-earth metals, semiconductors, dielectrics, ceramics, etc.

The invention enjoys particular utility in the manufacture disk-shaped magnetic and MO data/information storage and retrieval media wherein a plurality of thin film magnetic, non-magnetic, reflective, dielectric, etc., layers are deposited in stacked manner on a substrate by means of sputtering. In addition, the inventive apparatus and methodology are fully compatible with the requirements of automated, high-throughput magnetic and MO disk manufacture.

In addition to the above-described utility in the manufacture of disk-shaped recording/information retrieval media, the inventive means and methodology are applicable to sputter deposition processing for the manufacture of a wide variety of products. Specifically, the type of coatings deposited by the inventive apparatus and methodology is not limited to the specifically disclosed thin film layers for magnetic and MO recording media. Rather, the invention is broadly applicable to the deposition of various types of optical coatings as may be required in particular applications, wherein optical properties such as optical density, spectral or integral reflectance, spectral or integral transmittance, absorptance, scattering, etc., must be varied in e.g., a radial direction. The invention is also applicable to the formation of coatings which modify the physical and/or chemical properties of a substrate surface in, such as for providing a desired anti-friction, corrosion prevention, hardness, roughness, etc., characteristic to a particular surface portion.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present disclosure. It is to be understood that the present invention is capable of use in various other combinations and environments and is susceptible of changes and/or modifications within the scope of the inventive concept as expressed herein.

What is claimed is:

1. A method of sputtering a target, comprising steps of:
   (a) providing a magnetically enhanced sputtering apparatus comprising a sputtering target having a first, sputtering surface and a second, opposing surface facing and in electrical contact with a cathode of said sputtering apparatus;
   (b) sputtering said first surface of said target to form a first erosion track therein;
   (c) removing said target from said sputtering apparatus when said first erosion track reaches a predetermined depth below said first surface;
   (d) reinstalling said sputtering target in said sputtering apparatus such that said second surface is the sputtering surface and said first surface is the opposing surface and faces and is in electrical contact with said cathode via an intervening backing plate, said backing plate being comprised of at least one material selected for causing a second erosion track to be formed in said second surface of said target during sputtering therefrom which is laterally displaced from said first erosion track; and
   (e) sputtering said second surface of said target to form said laterally displaced second erosion track therein to a predetermined depth below said second surface, thereby increasing the utilization of said sputtering target.

2. The method as in claim 1, wherein:
step (a) comprises providing a magnetron sputtering apparatus.

3. The method as in claim 2, wherein:
step (a) comprises providing a planar magnetron sputtering apparatus.

4. The method as in claim 1, wherein:
step (a) comprises providing a sputtering target comprised of a material for forming a layer of a thin film magnetic or magneto-optical (MO) recording medium.

5. The method as in claim 4, wherein:
step (a) comprises providing a sputtering target comprised of a material selected from the group consisting of non-magnetic metals or alloys, magnetic metals or alloys, dielectrics, thermo-magnetic alloys, and carbon or carbon compounds.

6. The method as in claim 1, wherein:
step (d) comprises providing a backing plate comprised of a material which alters passage of magnetic flux through said target.

7. The method as in claim 6, wherein:

step (d) includes selecting the composition and thickness of said backing plate for obtaining said laterally displaced second erosion track on said second surface of said sputtering target.

8. The method as in claim 7, wherein:

step (d) comprises providing a backing plate comprised of Cr or a CoCr alloy.

9. The method as in claim 8, wherein:

step (d) comprises providing a backing plate wherein the Cr content ranges from 0 to about 100 at. %.

10. The method as in claim 8, wherein:

step (d) comprises providing a backing plate having a thickness from about 0.1 to about 1 inch.

11. A sputtering target comprising:

opposing first and second major surfaces, said first surface including a first erosion track formed therein by sputtering therefrom in a magnetically enhanced sputtering apparatus; and a backing plate mounted on said first surface, said backing plate being comprised of at least one material selected for causing a second erosion track to be formed in said second surface of said target during sputtering therefrom in said magnetically enhanced sputtering apparatus, said second erosion track being laterally displaced from said first erosion track.

12. The sputtering target according to claim 11, wherein:

said sputtering target is comprised of a material for forming a layer of a thin film magnetic or magneto-optical (MO) recording medium.

13. The sputtering target according to claim 12, wherein:

said sputtering target is comprised of a material selected from the group consisting of non-magnetic metals or alloys, magnetic metals or alloys, dielectrics, thermomagnetic alloys, and carbon or carbon compounds.

14. The sputtering target according to claim 11, wherein:

said backing plate is comprised of a material which alters passage of magnetic flux through said target.

15. The sputtering target according to claim 14, wherein:

the composition and thickness of said backing plate are selected for obtaining said laterally displaced second erosion track on said second surface of said sputtering target.

16. The sputtering target according to claim 15, wherein:

said backing plate is comprised of Cr or a CoCr alloy.

17. The sputtering target according to claim 16, wherein:

said backing plate has a Cr content ranging from 0 to about 100 at. % and a thickness ranging from about 0.1 to about 1 inch.

18. A magnetically enhanced sputtering apparatus comprising the target of claim 17.

19. A magnetically enhanced sputtering apparatus comprising the target of claim 11.

20. A method of sputtering a target, comprising steps of:

(a) sputtering a first side of said target to form a first erosion pattern therein; and (b) sputtering a second side of said target to form a second erosion pattern therein, said second erosion pattern offset from said first erosion pattern.

* * * * *